(12) United States Patent
Yamagata et al.

(10) Patent No.: US 6,200,878 B1
(45) Date of Patent: Mar. 13, 2001

(54) SOI SUBSTRATE PROCESSING METHOD

(75) Inventors: Kenji Yamagata, Sagamihara; Kiyofumi Sakaguchi, Yokohama, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/211,570

(22) Filed: Dec. 15, 1998

(30) Foreign Application Priority Data

Dec. 26, 1997 (JP) .................................................. 9-361017

(51) Int. Cl.⁷ .................................................. H01L 21/306
(52) U.S. Cl. .......................... 438/406; 438/409; 438/459; 438/960; 438/977
(58) Field of Search .................................... 439/406, 455, 439/459, 960, 977, FOR 485, 466, 409

(56) References Cited

U.S. PATENT DOCUMENTS

| | | | |
|---|---|---|---|
| 5,250,460 | * | 10/1993 | Yamagata et al. . |
| 5,371,037 | * | 12/1994 | Yonehara . |
| 5,374,581 | * | 12/1994 | Ichikawa et al. . |
| 5,405,802 | * | 4/1995 | Yamagata et al. . |
| 5,466,631 | * | 11/1995 | Ichikawa et al. . |
| 5,536,361 | * | 7/1996 | Kondo et al. . |
| 5,670,411 | * | 9/1997 | Yonehara et al. . |
| 5,750,000 | * | 5/1998 | Yonehara et al. . |
| 5,840,616 | * | 11/1998 | Sakaguchi et al. .................. 438/459 |
| 5,856,229 | * | 1/1999 | Sakaguchi et al. .................. 438/406 |

FOREIGN PATENT DOCUMENTS

| | | |
|---|---|---|
| 0 553 859A2 | 1/1993 | (EP) . |
| 0 603 849A1 | 12/1993 | (EP) . |
| 0 755 068A2 | 7/1996 | (EP) . |
| 5-198556 | 6/1993 | (JP) . |

OTHER PUBLICATIONS

European Search Report Dated Jul. 22, 1999.

* cited by examiner

*Primary Examiner*—Mary Wilczewski
(74) *Attorney, Agent, or Firm*—Morgan & Finnegan, L.L.P.

(57) ABSTRACT

An object of this invention is to provide a substrate processing method capable of satisfactorily performing in etching in the step of removing a porous silicon layer by etching. In order to achieve this object, a substrate processing method includes the anodizing step of forming a porous silicon layer on a major surface of a single-crystal silicon substrate, the silicon film formation step of growing a single-crystal silicon film on the porous silicon layer, the removal step of bonding a first substrate obtained by oxidizing a surface of the single-crystal silicon film to a second substrate as a supporting substrate, and removing a single-crystal silicon portion from a lower surface side of the first substrate to expose the porous silicon layer, and the etching step of etching the exposed porous silicon layer to remove the porous silicon layer on the single-crystal silicon film, wherein in washing after the anodizing step, a time in which the first substrate is removed from the electrolytic solution and exposed to the air until washing is limited to a range in which the porous silicon layer is prevented from remaining on the single-crystal silicon film in the etching step.

8 Claims, 9 Drawing Sheets

SOI SUBSTRATE PROCESSING METHOD

BACKGROUND OF THE INVENTION

The present invention relates to a substrate processing method and apparatus for mainly mass-producing SOI substrates having uniform quality and, more specifically, forming porous silicon used to manufacture SOI substrates, and an SOI substrate.

Porous silicon was found by A. Uhlir and D. R. Turner who were studying electropolishing of single-crystal silicon biased to a positive potential in an aqueous solution of hydrofluoric acid (to be abbreviated as "fluoric acid" hereinafter).

Later, to exploit the excellent reactivity of porous silicon, application to element isolation in which a thick insulating structure need be formed in manufacturing a silicon integrated circuit was examined, and a full isolation technology using a porous silicon oxide film (FIPOS: Full Isolation by Porous Oxidized Silicon) was developed (K. Imai, Solid State Electron 24, 159, 1981). This is the first example of application of porous silicon to the SOI (Silicon On Insulator) technology.

Recently, an applied technology to direct bonding in which a silicon epitaxial layer grown on a porous silicon substrate is bonded to an amorphous substrate or single-crystal silicon substrate via an oxide film has been developed (Japanese Patent Laid-Open No. 5-21338).

Details of this technology will be described below. First, a first substrate is etched in an electrolytic solution represented by HF solution to form a porous silicon layer on the surface of the substrate. A single-crystal silicon film is epitaxially grown on the porous silicon layer. This layer is grown as a non-porous single-crystal thin film although the underlying layer is porous. Subsequently, the surface of the epitaxial layer is oxidized. After cleaning, the oxide film surface and a second substrate are bonded and integrated by a heat treatment. The resultant structure is ground from the lower surface side of the first substrate to expose the porous layer. Finally, the porous silicon layer exposed to the surface is removed by etching while leaving the single-crystal silicon film, thereby obtaining a substrate having an SOI structure.

Conventionally, however, when the porous silicon layer is removed by etching, the porous silicon layer partially remains on the single-crystal silicon film.

SUMMARY OF THE INVENTION

The present invention has been made to solve the above problem, and has as its object to provide a substrate processing method and apparatus capable of satisfactory etching in the process of removing a porous silicon layer by etching.

It is another object of the present invention to provide an SOI substrate manufactured by the above processing method and apparatus.

In order to solve the above problem and achieve the above objects, a substrate processing method according to the first aspect of the present invention has the following steps.

There is provided a substrate processing method comprising the anodizing step of anodizing a single-crystal silicon substrate in an electrolytic solution to form a porous silicon layer on a major surface of the single-crystal silicon substrate, the silicon film formation step of growing a single-crystal silicon film on the porous silicon layer, the removal step of bonding a first substrate obtained by oxidizing a surface of the single-crystal silicon film to a second substrate as a supporting substrate, and removing a single-crystal silicon portion from a lower surface side of the first substrate to expose the porous silicon layer, and the etching step of etching the exposed porous silicon layer to remove the porous silicon layer on the single-crystal silicon film, wherein in washing after the anodizing step, a time in which the first substrate is removed from the electrolytic solution and exposed to the air until washing is limited to a range in which the porous silicon layer is prevented from remaining on the single-crystal silicon film in the etching step.

An SOI substrate according to the first aspect of the present invention has the following structure.

There is provided an SOI substrate manufactured by the substrate processing method of any one of claims 1 to 5.

A substrate processing method according to the second aspect of the present invention has the following steps.

There is provided a substrate processing method comprising the anodizing step of anodizing a single-crystal silicon substrate in an electrolytic solution to form a porous silicon layer on a major surface of the single-crystal silicon substrate, the silicon film formation step of growing a single-crystal silicon film on the porous silicon layer, the removal step of bonding a first substrate obtained by oxidizing a surface of the single-crystal silicon film to a second substrate as a supporting substrate, and removing a single-crystal silicon portion from a lower surface side of the first substrate to expose the porous silicon layer, and the etching step of etching the exposed porous silicon layer to remove the porous silicon layer on the single-crystal silicon film, wherein in washing after the anodizing step, a time in which the first substrate is removed from the electrolytic solution and exposed to the air until washing is set to be shorter than a time in which a compound produced by the electrolytic solution sticks to inner walls of pores formed by anodizing.

An SOI substrate according to the second aspect of the present invention has the following structure.

There is provided an SOI substrate manufactured by the substrate processing method of any one of claims 7 to 13.

A substrate processing method according to the third aspect of the present invention has the following steps.

There is provided a substrate processing method comprising the anodizing step of anodizing a single-crystal silicon substrate in an electrolytic solution to form a porous silicon layer on a major surface of the single-crystal silicon substrate, the silicon film formation step of growing a single-crystal silicon film on the porous silicon layer, the removal step of bonding a first substrate obtained by oxidizing a surface of the single-crystal silicon film to a second substrate as a supporting substrate, and removing a single-crystal silicon portion from a lower surface side of the first substrate to expose the porous silicon layer, and the etching step of etching the exposed porous silicon layer to remove the porous silicon layer on the single-crystal silicon film, wherein in washing after the anodizing step, a time in which the first substrate is removed from the electrolytic solution and exposed to the air until washing is limited to be not more than 3 min.

An SOI substrate according to the third aspect of the present invention has the following structure.

There is provided an SOI substrate manufactured by the substrate processing method of any one of claims 15 to 18.

A substrate processing apparatus according to the first aspect of the present invention has the following arrangement.

There is provided a substrate processing apparatus for performing the anodizing step of anodizing a single-crystal silicon substrate in an electrolytic solution to form a porous silicon layer on a major surface of the single-crystal silicon substrate, the silicon film formation step of growing a single-crystal silicon film on the porous silicon layer, the removal step of bonding a first substrate obtained by oxidizing a surface of the single-crystal silicon film to a second substrate as a supporting substrate, and removing a single-crystal silicon portion from a lower surface side of the first substrate to expose the porous silicon layer, and the etching step of etching the exposed porous silicon layer to remove the porous silicon layer on the single-crystal silicon film, wherein a plurality of first substrates can be processed at once in the anodizing step, and in washing after the anodizing step, all the first substrates can be transferred in a time in which each first substrate is removed from the electrolytic solution and exposed to the air until washing is limited to a range in which the porous silicon layer is prevented from remaining on the single-crystal silicon film in the etching step.

An SOI substrate according to the fourth aspect of the present invention has the following structure.

There is provided an SOI substrate manufactured by the substrate processing apparatus of any one of claims 20 to 24.

A substrate processing apparatus according to the second aspect of the present invention has the following arrangement.

There is provided a substrate processing apparatus for performing the anodizing step of anodizing a single-crystal silicon substrate in an electrolytic solution to form a porous silicon layer on a major surface of the single-crystal silicon substrate, the silicon film formation step of growing a single-crystal silicon film on the porous silicon layer, the removal step of bonding a first substrate obtained by oxidizing a surface of the single-crystal silicon film to a second substrate as a supporting substrate, and removing a single-crystal silicon portion from a lower surface side of the first substrate to expose the porous silicon layer, and the etching step of etching the exposed porous silicon layer to remove the porous silicon layer on the single-crystal silicon film, wherein a plurality of first substrates can be processed at once in the anodizing step, and in washing after the anodizing step, all the first substrates can be transferred in a time in which each first substrate is removed from the electrolytic solution and exposed to the air until washing is set to be shorter than a time in which a compound produced by the electrolytic solution sticks to inner walls of pores formed by anodizing.

An SOI substrate according to the fifth aspect of the present invention has the following structure.

There is provided an SOI substrate manufactured by the substrate processing apparatus of any one of claims 26 to 32.

A substrate processing apparatus according to the third aspect of the present invention has the following arrangement.

There is provided a substrate processing apparatus for performing the anodizing step of anodizing a single-crystal silicon substrate in an electrolytic solution to form a porous silicon layer on a major surface of the single-crystal silicon substrate, the silicon film formation step of growing a single-crystal silicon film on the porous silicon layer, the removal step of bonding a first substrate obtained by oxidizing a surface of the single-crystal silicon film to a second substrate as a supporting substrate, and removing a single-crystal silicon portion from a lower surface side of the first substrate to expose the porous silicon layer, and the etching step of etching the exposed porous silicon layer to remove the porous silicon layer on the single-crystal silicon film, wherein a plurality of first substrates can be processed at once in the anodizing step, and in washing after the anodizing step, all the first substrates can be transferred in a time in which each first substrate is removed from the electrolytic solution and exposed to the air until washing is not more than 3 min.

An SOI substrate according to the sixth aspect of the present invention has the following structure.

There is provided an SOI substrate manufactured by the substrate processing apparatus of any one of claims 34 to 37.

Other objects and advantages besides those discussed above shall be apparent to those skilled in the art from the description of a preferred embodiment of the invention which follows. In the description, reference is made to accompanying drawings, which form a part hereof, and which illustrate an example of the invention. Such example, however, is not exhaustive of the various embodiments of the invention, and therefore reference is made to the claims which follow the description for determining the scope of the invention.

DETAILED DESCRIPTION OF THE PREFERRED EMBODIMENTS

Embodiments of a substrate processing apparatus (mainly an anodizing apparatus) according to the present invention will be described below. Before the description, an embodiment of a method of manufacturing a semiconductor substrate using the anodizing apparatus in some steps will be described.

FIGS. 1A to 1F are views showing a method of manufacturing a semiconductor substrate. This will be briefly described. In this manufacturing method, a first substrate prepared by forming a porous silicon layer on a single-crystal silicon substrate, a non-porous layer on the porous silicon layer, and preferably an insulating film on the non-porous layer is bonded to an independently prepared second substrate via the insulating film. After this, the single-crystal silicon substrate is removed from the lower surface of the first substrate, and the porous silicon layer is etched, thereby manufacturing a semiconductor substrate.

The method of manufacturing a semiconductor substrate will be described in more detail with reference to FIGS. 1A to 1F.

Figure 1A:
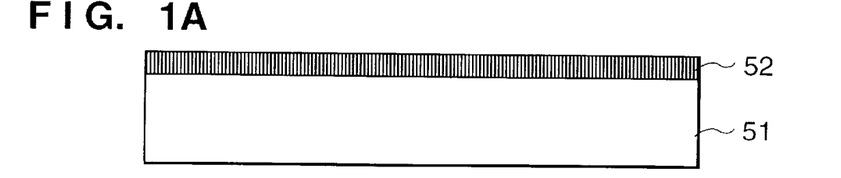
FIGS. 1A to 1F are views showing the steps in manufacturing a semiconductor substrate.

First, a single-crystal Si substrate 51 for forming a first substrate is prepared, and a porous Si layer 52 is formed on the major surface (FIG. 1A). The porous Si layer 52 can be formed by processing the major surface of the single-crystal substrate 51 by the anodizing apparatus of the embodiment to be described later.

Figure 1B:
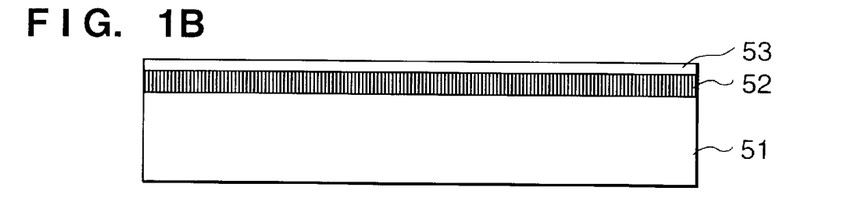

At least one non-porous layer 53 is formed on the porous Si layer 52 (FIG. 1B). As the non-porous layer 53, a single-crystal Si layer, a poly-Si layer, an amorphous Si layer, a metal layer, a semiconductor compound layer, a superconductor layer is suitable. A device structure such as a MOSFET may be formed in the non-porous layer 53.

Figure 1C:
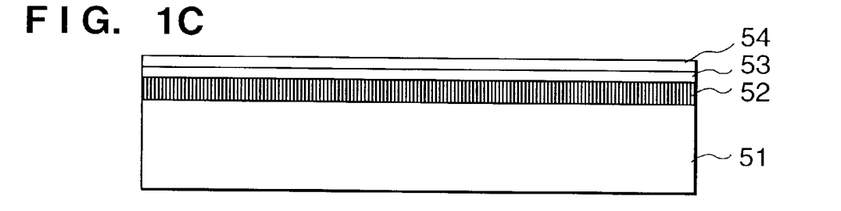

An $SiO_2$ layer 54 is formed on the non-porous layer 53, and the resultant structure is preferably used as the first substrate (FIG. 1C). This $SiO_2$ layer 54 is applicable because when the first substrate is bonded to a second substrate 55 in the subsequent step, the interface level of the bonding interface can be separated from the active layer.

Figure 1D:
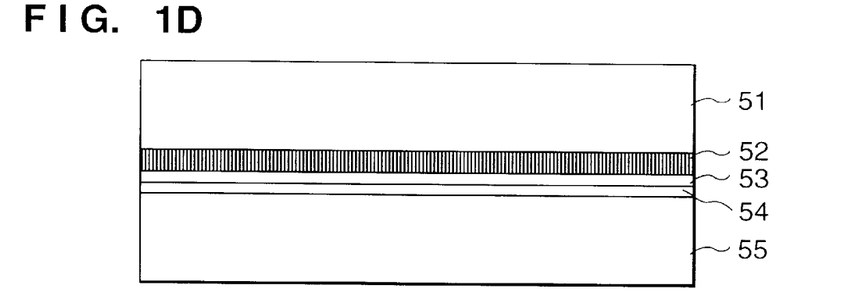

Subsequently, the first substrate is brought into contact with the second substrate 55 at room temperature via the $SiO_2$ layer 54 (FIG. 1D). After this, anode bonding, pressing, heat treatment as needed, or a combination thereof may performed to firmly bond the substrates.

When a single-crystal Si layer is formed as the non-porous layer 53, the first substrate is preferably bonded to the second substrate 55 after the $SiO_2$ layer 54 is formed on the surface of the single-crystal Si layer by, e.g., thermal oxidation.

As the second substrate 55, an Si substrate, a substrate obtained by forming an $SiO_2$ layer on an Si substrate, a transparent substrate consisting of silica glass, or a sapphire substrate is suitable. Any other substrate can be used as far as the second substrate 55 has a sufficiently flat surface to be bonded.

FIG. 1D shows a state wherein the first substrate and the second substrate are bonded via the $SiO_2$ layer 54. If the non-porous layer 53 or the second substrate does not consist of Si, the $SiO_2$ layer 54 need not be formed.

In bonding, an insulating thin plate may be inserted between the first substrate and the second substrate.

Figure 1E:
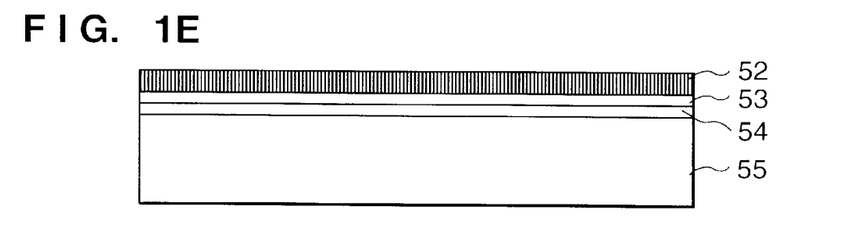

The first substrate is removed from the second substrate at the porous Si layer 52 (FIG. 1E). To remove the first substrate, the first method using grinding, polishing, or etching (the first substrate is discarded) or the second method of separating the first substrate from the second substrate at the porous layer 52 is used. In the second method, when the porous Si layer remaining on the separated first substrate is removed, and the surface is planarized as needed, the substrate can be reused.

Figure 1F:
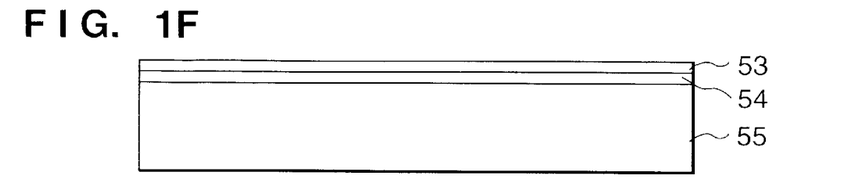

Subsequently, only the porous Si layer 52 is etched and removed while leaving the non-porous layer 53 (FIG. 1F).

FIG. 1F schematically shows a semiconductor substrate obtained by the above manufacturing method. According to the manufacturing method, the non-porous layer 53 (e.g., a single-crystal Si layer) is formed flat and uniformly in the entire region on the surface of the second substrate 55.

When an insulating substrate is used as the second substrate 55, the semiconductor substrate obtained by the above manufacturing method is very applicable to form an insulated electronic device.

Formation of a porous silicon substrate by anodizing or formation of pores is performed in, e.g., an HF solution. It is known that the presence of holes is essential for this processing, and the reaction mechanism is estimated as follows.

First, holes in the silicon substrate applied with an electric field in the HF solution are induced on the surface on the negative electrode side. Consequently, the density of Si—H bonds compensating for the unbonded element on the surface becomes high. At this time, F ions in the HF solution on the negative electrode side nucleophilically attack the Si—H bonds to form Si—F bonds. By this reaction, $H_2$ molecules are generated, and simultaneously, one electron is emitted to the positive electrode side. Si—Si bonds near the surface weaken due to the polarization characteristics of Si—F bond. This weak Si—Si bonds are attacked by HF or $H_2O$, so Si atoms on the surface become $SiF_4$ and are eliminated from the crystal surface. As a consequence, recessed portions are formed in the crystal surface. A field distribution (field concentration) for preferentially attracting holes is generated at this portion. This surface heterogeneity extends, so etching of silicon atoms continuously progresses along the electric field. The solution used for anodizing is not limited to the HF solution, and any other electrolytic solution can be used.

One of technical points of the process shown in FIGS. 1A to 1E is the final step of removing the porous silicon layer by etching while leaving the single-crystal silicon film. Since both the epitaxial silicon layer (single-crystal silicon film) to be left and the porous silicon layer to be removed are made of single-crystal silicon, the chemical etching rate is supposed to basically equal. However, in this process, the etching selectivity ratio necessary to form a very thin SOI film (about 0.1 $\mu$m) with a satisfactory film thickness distribution is about 100,000 times. In the above process, this selectivity ratio is realized. The reason why the etching rate of porous silicon is higher than that of non-porous silicon by 100,000 times is that the etchant filling the pores in the porous layer etches the pore walls to physically break the entire porous layer.

As an apparatus for forming porous silicon for the above process, i.e., an anodizing apparatus, an apparatus which supports a silicon substrate at its side surface (beveling) regions can be used (Japanese Patent Laid-Open No. 5-198556). In this anodizing apparatus, a silicon substrate is supported at its beveling portions and set in an anodizing tank. Metal electrodes of platinum or the like are placed at the two ends of the anodizing tank. The anodizing tank is filled with an electrolyte such as fluoric acid. To efficiently remove a gas (bubbles) produced by an anodizing reaction from the substrate surface, an alcohol is often added to the electrolyte. The electrolyte is isolated via the substrate to the upper and lower surface sides of the substrate. In this state, a negative potential is applied to the electrode on the upper surface side of the substrate, thereby anodizing the upper surface side of the substrate.

Etching of silicon in anodizing is explained by the following formulas.

$$Si+2HF+(2-n)e^+ \rightarrow SiF_2+2H+ne^-$$

$$2SiF_2 \rightarrow Si+SiF_4$$

$$SiF_4+2HF \rightarrow H_2SiF_6$$

When a silicon compound $H_2SiF_6$ is produced from fluoric acid, silicon is etched. As is apparent from the above formulas, as the concentration of HF (fluoric acid) increases, the amount of produced $H_2SiF_6$ also increases. $H_2SiF_6$ hardly reacts with an acid represented by fluoric acid or an alkali solution. That is, $H_2SiF_6$ is hardly dissolved.

In the progress of anodizing reaction, several ten to several hundred Å pores are formed in the substrate surface and extend along the direction of electric field. That is, the electrolyte (HF solution) enters each pore and causes a reaction at the distal end of the pore. Even when the electric field disappears, the HF solution is kept confined in each pore. As a problem, the HF solution confined in the pores continues the reaction and continuously produces $H_2SiF_6$ even after the electric field disappears. When the produced $H_2SiF_6$ sticks to the inner surfaces of the pores, the porous silicon layer cannot be removed by etching in the final process.

For easy etching, production of $H_2SiF_6$ in the pores must be suppressed. For this purpose, the concentration of HF in the pores must be prevented from increasing.

Figure 8A:
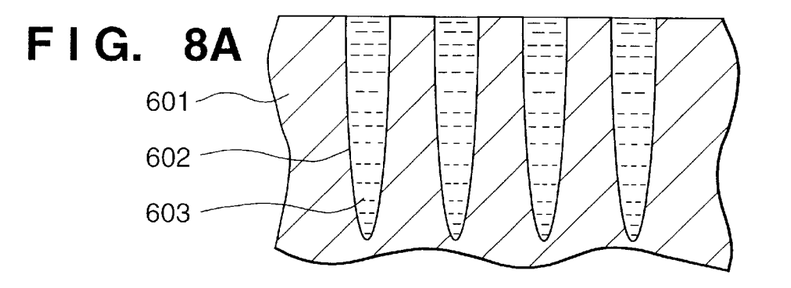
FIGS. 8A to 8D are views showing the state in a porous layer when the resultant structure is left to stand in the air a certain time after anodizing, and then cleaned and dried.

FIGS. 8A to 8D show the model of a state in the pores when anodizing is complete, and after a short time (e.g., 7 min), washing and drying are performed. FIG. 8A is a sectional view showing the state in the porous layer immediately after anodizing is ended, and the resultant structure is removed into the air. Pores 602 are formed in a substrate 601 by anodizing, and an HF solution 603 remains in each pore. As described above, the HF solution is often a mixed solution of fluoric acid and an alcohol.

Figure 8B:
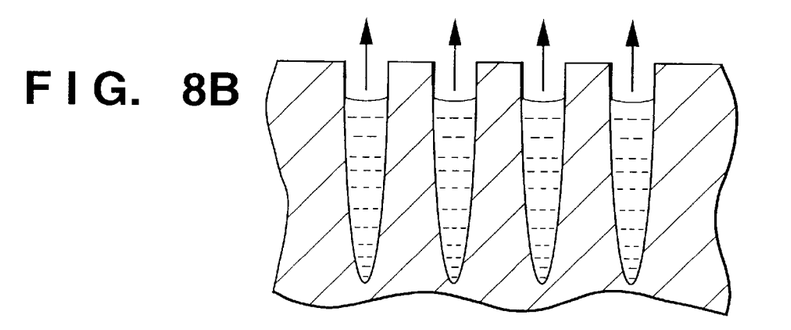

FIG. 8B shows a state wherein the resultant structure is left to stand in the air for several minutes. Water or alcohol in the HF solution readily evaporates, and the solution is concentrated by evaporation.

Figure 8C:
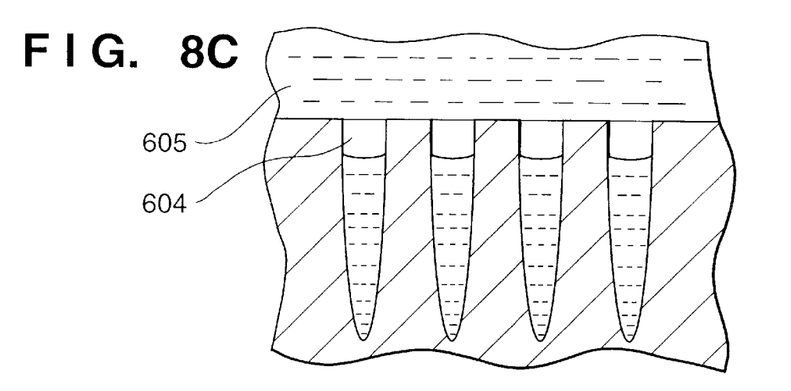
Figure 8D:
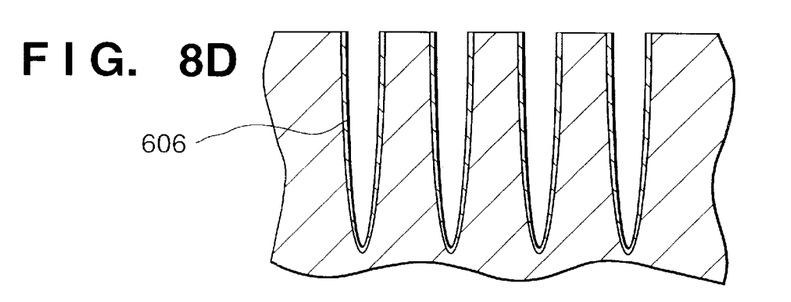

FIG. 8C shows a state wherein the resultant structure is washed. The substrate treated with fluoric acid is normally subjected to the next process after the fluoric acid is removed by washing. At this time, the solution (cleaning water and, more specifically, pure water) enters each pore due to capillarity to be mixed with the concentrated HF solution. When the fluoric acid diffuses outside the pores, the fluoric acid in the pores are replaced with pure water, and the pores are cleaned. An injection depth H of the solution in the pores due to capillarity is given by:

$$H = 2\gamma \cdot \cos\theta / a\rho g$$

where $\gamma$ is the surface tension, $\theta$ is the wetting angle of the solution with respect to the substrate, $a$ is the pore size, $\rho$ is the density of the solution, and $g$ is the gravitational acceleration. Since the surface of the substrate 601 which is being treated with fluoric acid is hydrophobic, the wetting angle $\theta$ of water is very large, so the injection depth H of water is almost zero. That is, the cleaning water cannot enter the pores deeply. For this reason, an air layer 604 is formed in each pore near the surface. In this case, even when washing is complete, and water is removed using a spin drier or the like, fluoric acid in each pore is not replaced and is concentrated. Finally, the solution in each pore completely evaporates, and a product 606 sticks to the pore walls, as shown in FIG. 8D. This product 606 is the above-described $H_2SiF_6$.

Figure 9A:
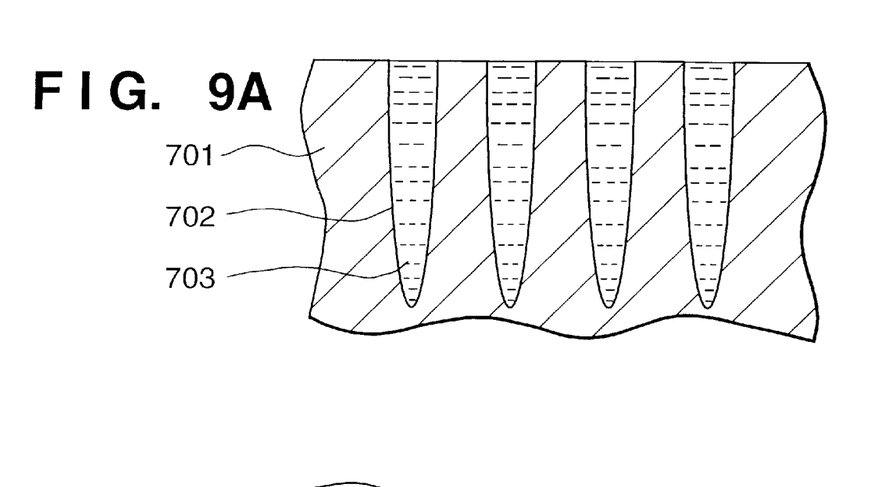
FIGS. 9A to 9C are views showing the state in the porous layer when cleaning and drying are performed immediately after anodizing.
Figure 9B:
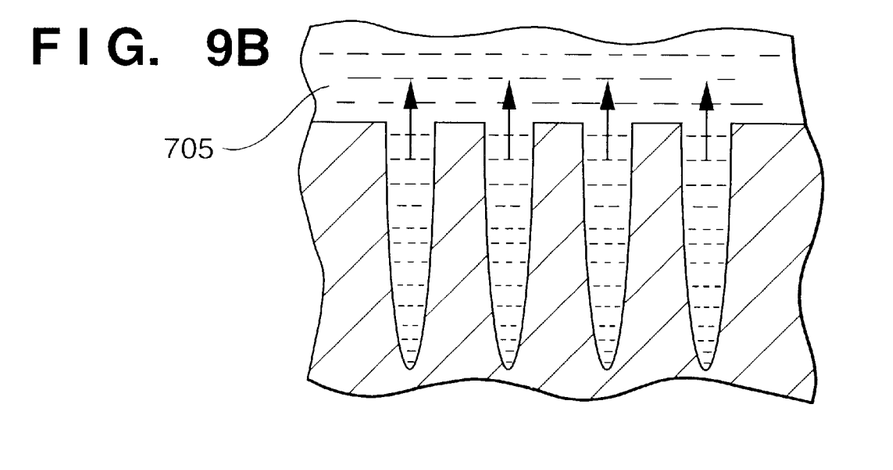
Figure 9C:
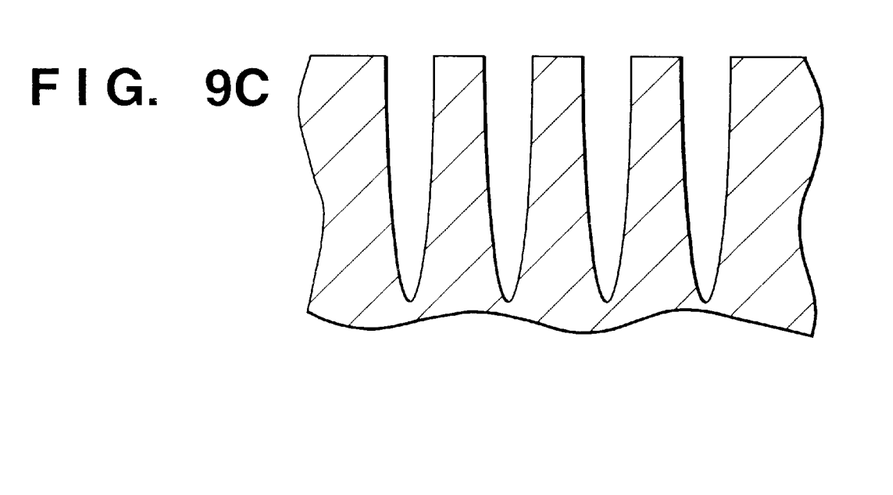

FIGS. 9A to 9C show a state wherein washing is performed immediately after anodizing is complete.

FIG. 9A is a sectional view showing the state in the porous layer immediately after anodizing is ended, and the resultant structure is removed into the air. FIG. 9B shows a state wherein a substrate 701 is immediately moved into pure water 705.

Since the liquid surface of an HF solution 703 in each pore is almost flush with the surface of the substrate 701, the pure water 705 is mixed with the solution 703 without forming an air layer. When washing is sufficiently performed, the HF solution 703 is diluted, so most of the HF solution 703 is replaced with water. When the resultant structure is dried using a spin drier or the like, a porous silicon layer having no product in the pores is obtained, as shown in FIG. 9C.

Figure 10:
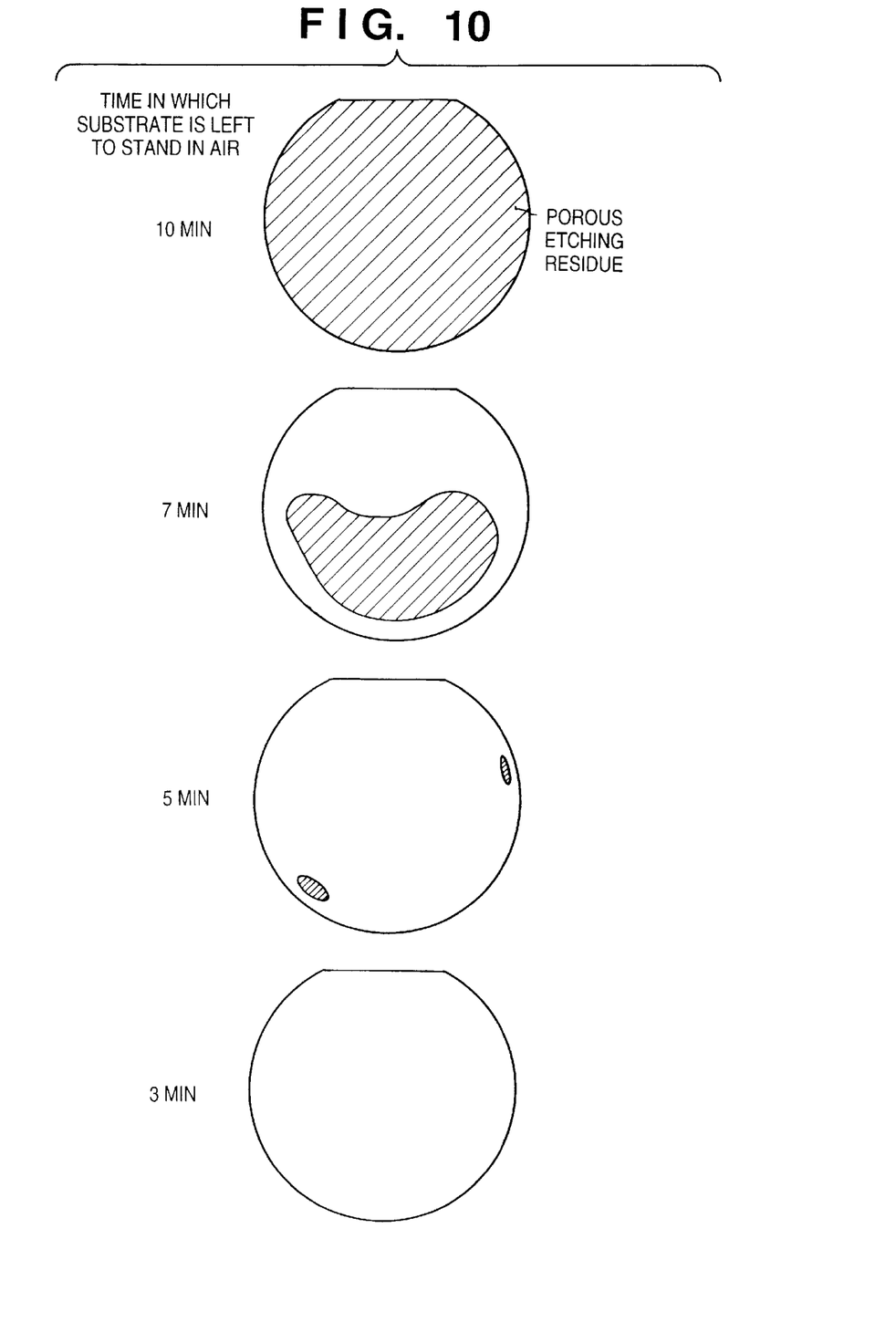
FIG. 10 is a view showing the porous etching characteristics of the entire substrate surface when the resultant structure is left to stand in the air a certain time after anodizing, and then cleaned and dried.

FIG. 10 shows an observation result based on experiments about the relationship between the time in which the anodized substrate is left to stand in the air and the porous etching residue in the final process. The experiment conditions are as follows.

Substrate . . . 6-inch p-type (0.01 to 0.02 Ωcm), thickness: 625 μm

Electrolytic solution . . . HF: $C_2H_5OH$=2:1

Anodizing current . . . 1 mA/cm$^2$

Anodizing time . . . 11 min

After anodizing, epitaxial growth to 0.3 μm and oxidation of the epitaxial growth layer to 0.2 μm are performed. The substrate is cleaned and bonded to the a silicon substrate as the second substrate. After bonding, a heat treatment is performed at 1,100° C. for 2 hrs. The porous layer side of the substrate is ground by a grinding apparatus called a back-grinder by about 615 μm, the porous silicon layer is exposed. The substrate is etched using a solution of HF: $H_2O_2$=1:100.

As a result, differences as shown in FIG. 10 are observed. The time in which the substrate is left to stand in the air after anodizing is 10, 7, 5, and 3 min from the upper side of the drawing. The hatched portion indicates the porous layer residue which cannot be etched. As is apparent from this result, the time in which the substrate is left to stand in the air after anodizing and the etching characteristics of the porous layer have a relationship. The time in which the substrate is left to stand is preferably as short as possible. In the actual process, however, a certain time need be taken into consideration. For example, an automatic anodizing apparatus must be designed in consideration of the water discharge and supply times, robot actuation time, and the like.

This experiment reveals that the allowable time in which the substrate removed from the electrolyte is exposed to the air after anodizing is 3 min or less. However, when a solution with high fluoric acid concentration is used, an etching residue may be generated even in an air exposure time of 3 min. Hence, the time in which the substrate is left to stand in the air is preferably 2 min or less.

The anodizing apparatus according to the preferred embodiment of the present invention is an automatic apparatus having a substrate conveyor robot and the like and capable of anodizing a plurality of substrates at once in order to achieve the object of the present invention, i.e., mass-produce SOI substrates with uniform quality, as described above. The anodizing apparatus also has an arrangement for uniformly exposing all substrates to the air for 3 min or less from the end of anodizing to the start of cleaning with pure water.

The number of substrates to be processed at once is most important in designing the apparatus. If a single substrate conveyor robot is used as the substrate conveyor robot, the number of substrates to be processed by the apparatus depends on the time required to transfer one substrate from the anodizing tank to the pure water rinse tank. Assume that the substrate transfer time is 20 sec per substrate. If conveyance of all substrates is complete within 3 min, the apparatus can process nine substrates at once.

In fact, when the substrate is to be transferred after anodizing and discharge of the electrolyte are complete, the discharge time must be taken into consideration. If the substrates are vertically held and processed in the anodizing tank, the upper portion of each substrate is exposed to the air first during discharge, and the lower portion is exposed to the air later. The reason why the discharge time poses a problem is that the reference must be set on the portion which is exposed to the air first. Assume that the discharge time of the apparatus having the robot is 40 sec. If the transfer time is 20 sec, only seven substrates can be transferred in 3 min. The apparatus can process only seven substrates at once.

However, an apparatus which does not require discharge is also possible. Without discharge, only the transfer time by the robot need be taken into consideration. It is only necessary to transfer one substrate within 3 min, and basically, the number of substrates to be processed at once is not limited. In this case, however, the chemical resistance of the arm or substrate supporting member of the robot must be taken into consideration because the conveyor robot need be dipped in the electrolyte. In addition, particles or impurities produced when the robot is dipped in the chemical solution also require sufficient care.

As another form, substrate transfer after anodizing may be omitted. That is, the electrolyte is discharged after anodizing, and pure water is supplied into the same tank to rinse the substrates. In this case, only the discharge time and supply time need be taken into consideration. For example, when the electrolyte is discharged in 40 sec, and water is supplied in 40 sec, the time in which the upper end portion of each substrate is exposed to the air is 3 min or less. Once the rinse with pure water is sufficiently performed, the substrate can be transferred to the drying stage or another cleaning stage in a longer time. In this case as well, the number of substrates to be processed is not limited basically.

As still another form, an anodizing apparatus having a full wafer conveyor robot as the substrate conveyor robot. In this apparatus, since all substrates are transferred at once independently of the number of substrates, the discharge time and transfer time of one cycle are taken into consideration. The advantage of a shorter process time of full transfer is also effective in the anodizing apparatus which can supply water to the same tank after discharge. However, full transfer can hardly be realized unless the substrate supporting method in the anodizing apparatus is sufficiently considered. The reason for this is as follows. Since anodizing is performed while completely sealing the substrate at the periphery and preventing current leakage, the seal interferes with the robot to set substrates in the holder or hold the substrates set in the holder at once.

(First Embodiment)

The first embodiment of the present invention will be described next with reference to the accompanying drawings.

Figure 2:
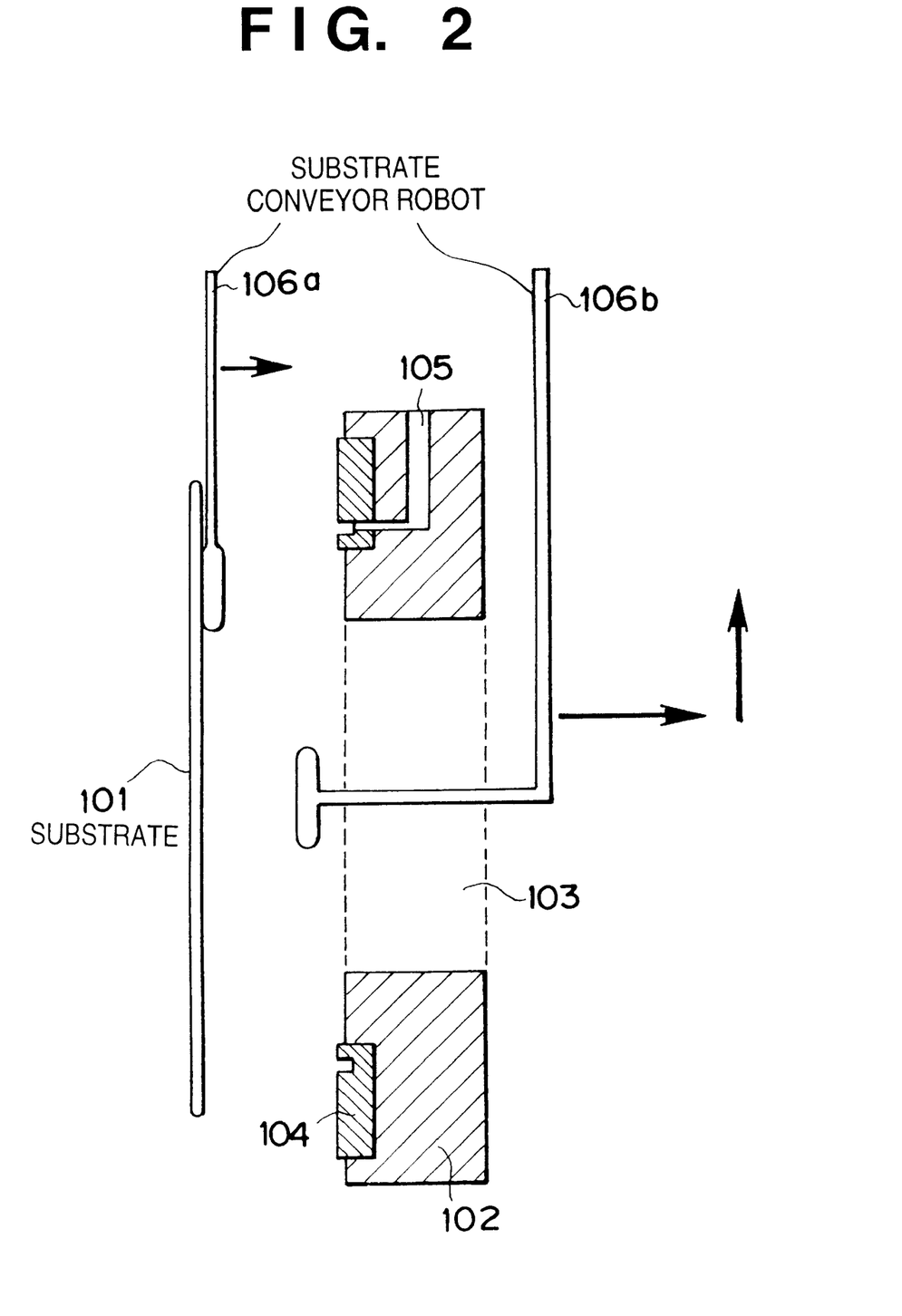
FIG. 2 is a schematic sectional view for explaining the functions of a holder portion and single substrate conveyor robot of an anodizing apparatus.
Figure 3:
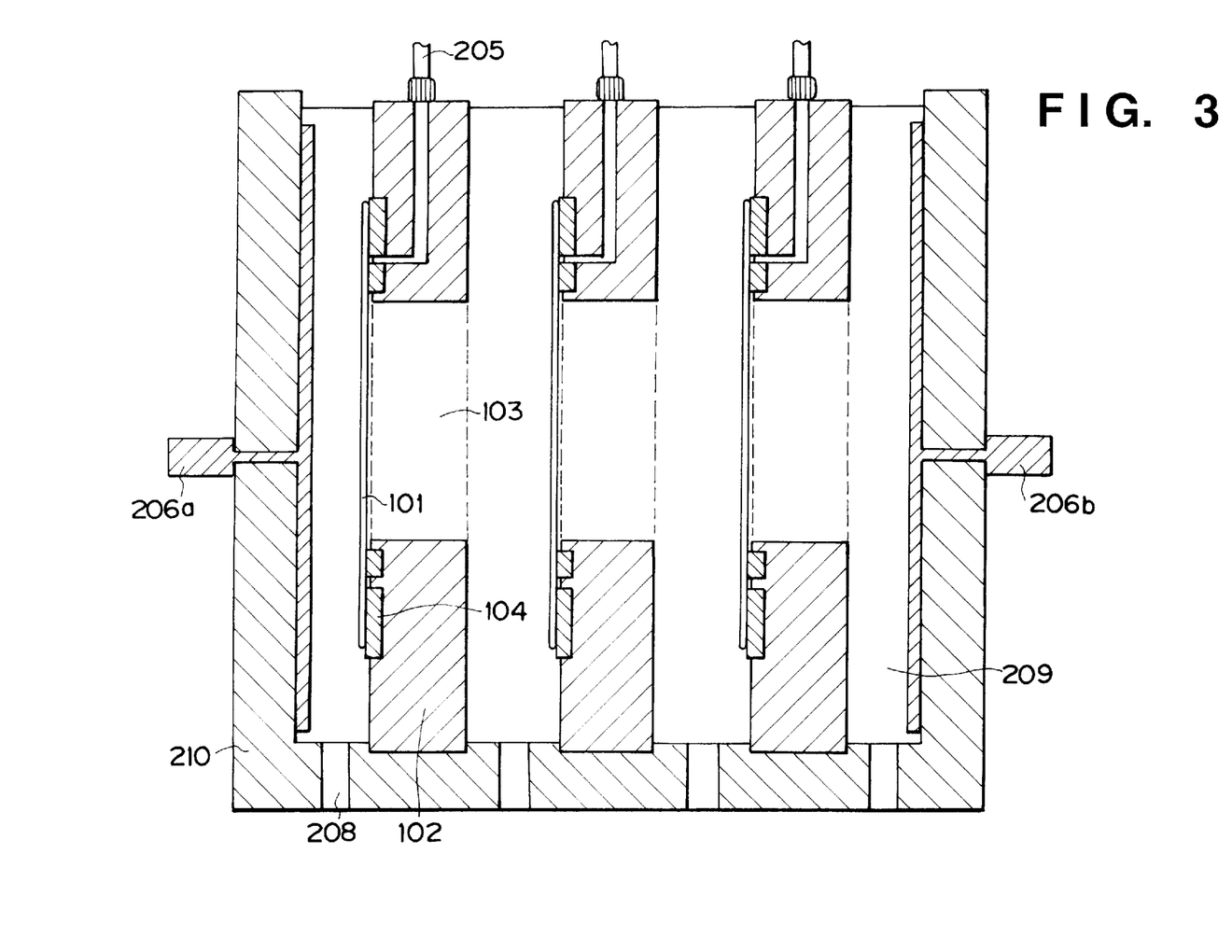
FIG. 3 is a view for explaining an example of an anodizing tank.
Figure 4:
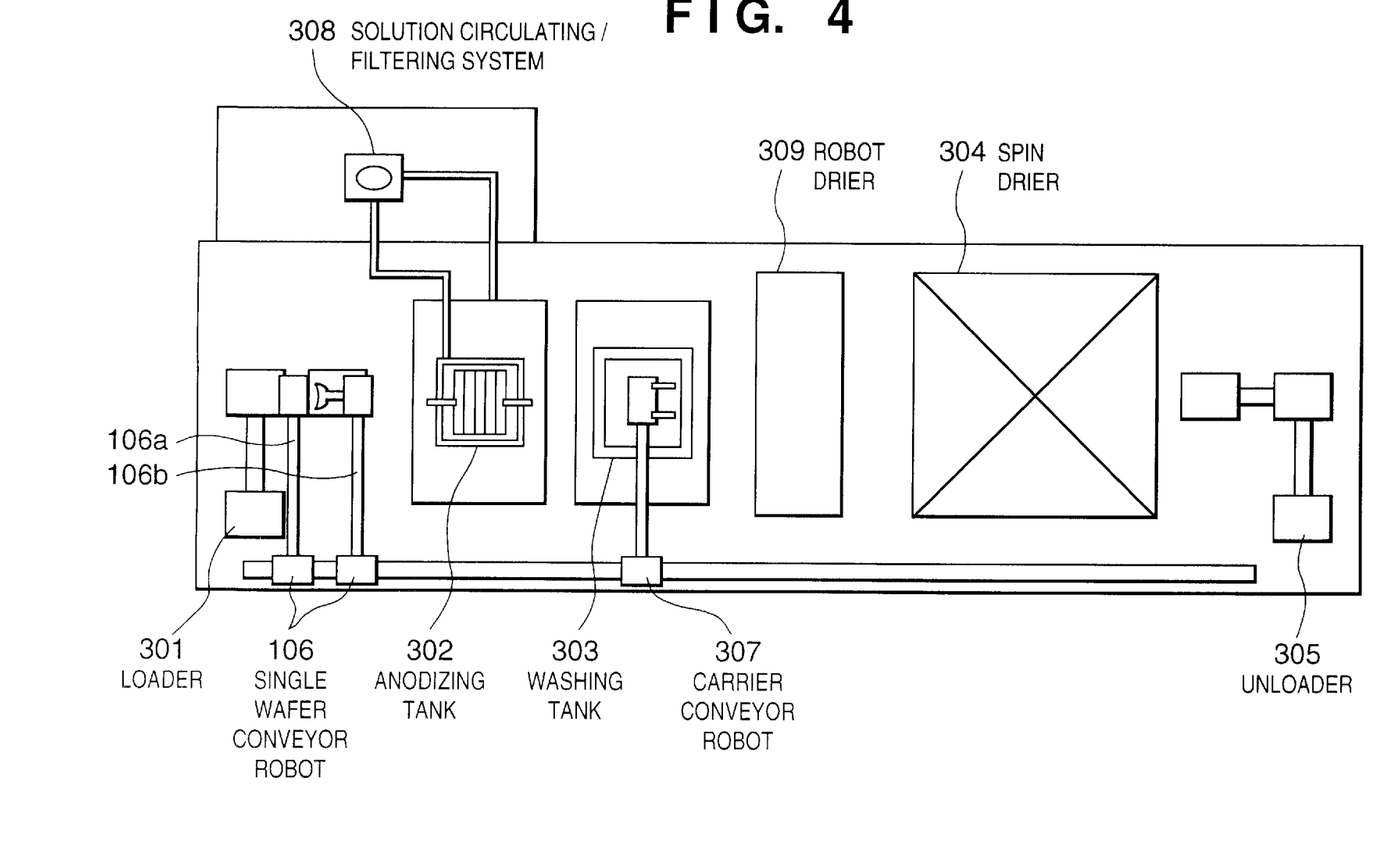
FIG. 4 is a view for explaining an example of a system of the anodizing apparatus.

FIGS. 2 to 4 show the holder, substrate conveyor robot, anodizing tank of an anodizing apparatus of the first embodiment, and an anodizing system using this apparatus.

In this embodiment, an anodizing apparatus for processing three substrates at once will be described. FIG. 2 is a schematic view of the substrate holding portion (to be referred to as a "holder" hereinafter) and substrate conveyor robot in the anodizing apparatus.

A holder 102 has a circular opening portion 103 almost at the center of a rectangular plate, and an annular substrate chuck pad (to be referred to as a "pad" hereinafter) 104 is buried along the opening portion. A groove is formed in the pad surface, and the pressure in the groove can be reduced from the lower surface of the pad through an exhaust line 105. Reference numerals 106a and 106b denote substrate conveyor robots which are actuated in a pair.

First, the robot 106a holds the lower surface of a substrate 101 by vacuum-chucking and moves it parallel and close to the surface of the holder 102. Subsequently, the robot 106b inserts its L-shaped portion into the opening portion 103 of the holder 102 and waits for the substrate 101. The robot 106b also has the vacuum-chucking function, like the robot 106a.

When the lower surface of the substrate 101 comes into contact with the distal end of the robot 106b, the robot 106b chucks the substrate 101. The robot 106a cancels chucking and escapes upward.

When the robot 106b moves to the right side of the drawing, the lower surface of the substrate 101 comes into contact with the pad 104. Since the pressure in the groove of the pad 104 is reduced through the exhaust line 105, the substrate 101 is chucked on the pad 104. The robot 106b escapes upward through the opening portion 103. The substrate 101 is held by the holder 102 in the above manner. To release the substrate 101, an operation reverse to the above procedure is performed.

FIG. 3 is a schematic sectional view of an anodizing apparatus having three holders shown in FIG. 2.

A negative electrode 206a and positive electrode 206b are arranged at the two ends of an anodizing tank 210. The three holders 102 are sandwiched in tandem between the electrodes. FIG. 3 shows a state wherein the substrates 101 have already been held by the holders 102. The space between the electrode and the holder or between the holders is filled with an electrolyte 209 (more specifically, fluoric acid), so the chambers containing the electrolyte are isolated from each other by the substrates 101. Anodizing is performed by applying a DC voltage across the electrodes 206a and 206b in this state. After anodizing, the electrolyte 209 is discharged from a discharge port 208.

FIG. 4 is a plan view of the anodizing system incorporating the above anodizing apparatus. The stage constituting the system has, from the left side, a loader 301, an anodizing tank 302, a washing tank 303, a robot drier 309, a spin drier 304, and an unloader 305. A single substrate conveyor robot 106 and a carrier conveyor robot 307 which have moving axes in the direction of alignment. The single substrate conveyor robot comprises the two portions 106a and 106b, as shown in FIG. 2. This system also has a system 308 for circulating and filtering the electrolyte in the anodizing tank. The carrier conveyor robot 307 moves the substrates from the washing tank 303 to the spin drier 304 together with the carrier, and then is dried by the robot drier 309 midway in returning to the washing tank 303.

Silicon was anodized using the above system.

As an anodizing condition, a mixed solution of fluoric acid and ethanol at 2:1 was used as the electrolyte. The current density in anodizing was 1 mA/cm$^2$, and processing was performed for 11 min. After anodizing, the electrolyte was discharged in 30 sec using a discharge pump (not shown). Simultaneously with the end of discharge, the single substrate conveyor robot 106 sequentially transferred anodized substrates from a side close to the negative electrode to a wafer carrier which had been set in the washing tank 303 in advance. Transfer of one substrate required 25 sec, and transfer of the second and third substrates required 23 sec and 21 sec, respectively. After anodizing and the start of discharge, a time of 1 min and 39 sec was required until all the three substrates were transferred to the washing tank 303.

A 0.3-$\mu$m thick single-crystal silicon layer was epitaxially grown on the porous silicon layer formed by the above process using a commercially available CVD apparatus. The surface of the epitaxial growth layer was anodized to 0.2 µm. This substrate and a silicon substrate which was prepared in advance were cleaned using a chemical solution of an acid and an alkali and bonded in a clean atmosphere. The bonded substrates were subjected to a heat treatment at 1,100° C. in a nitrogen atmosphere for 2 hrs and integrated.

The anodized side of the integrated substrates was ground using a backgrinder to remove the silicon substrate portion until the porous layer was exposed. After the porous layer was exposed, the structure was dipped in a mixed solution of fluoric acid and hydrogen peroxide at 1:100 and left to stand for 2 hrs to remove the porous portion while leaving the epitaxial growth layer. The porous portion was completely removed, and the epitaxial silicon layer was exposed to the surface.

With the above process, an SOI substrate having a 0.2-µm thick active layer and a 0.2-µm thick buried oxide layer was obtained.

(Second Embodiment)

The second embodiment will be described with reference to FIGS. 2 to 4.

In the second embodiment, the same holders and substrate conveyor robot as in the first embodiment are used. The number of holders increases from three in FIG. 3 to 25.

Since the operation and speed of the substrate conveyor robot are the same as in the first embodiment, a long time is required to transfer 25 substrates by single substrate transfer.

To prevent this, in this embodiment, discharge of the electrolyte after anodizing is omitted. More specifically, the arm of a single substrate conveyor robot 106 is dipped in the electrolyte based on fluoric acid and an alcohol to directly remove the substrate from the solution. The time in which each substrate is exposed to the air corresponds to the conveyance time of the robot 106 from removal of the substrate from the electrolytic solution to dipping of the substrate in pure water in a washing tank 303. The material of the arm and substrate chuck portion of the robot 106 is limited to a material having HF resistance. In this embodiment, a rod member of stainless steel with high rigidity which was inserted into a Teflon pipe (Teflon is the tradename of du Pont, U.S.A) was used as the arm of the robot. The chuck portion of a robot 106b (FIG. 2) consisted of a fluororubber.

The 25 substrates transferred to the washing tank 303 were cleaned using pure water for 40 min after the last substrate was transferred to the washing tank 303. The subsequent processes were executed as in the first embodiment, and 25 SOI substrates with uniform quality without any porous layer residue were obtained, as in the first embodiment.

(Third Embodiment)

The third embodiment will be described with reference to FIGS. 2 to 4.

In the third embodiment, the same holders and substrate conveyor robot as in the second embodiment are used. That is, 25 holders are used. In the third embodiment, the electrolyte is discharged after anodizing. Immediately after this, pure water is supplied into an anodizing tank 302 without transferring the substrates to a washing tank 303 and sufficiently cleaned in the anodizing tank 302. The time in which the 25 substrates are exposed to the air is about 30 sec for discharge of the electrolyte and about 40 sec for supply of pure water, i.e., a total of 1 min and 10 sec.

The pure water rinse time in the anodizing tank 302 was about 40 min. After this, the pure water in the anodizing tank 302 was discharged, and the substrates were transferred to the washing tank 303 by a single substrate conveyor robot 106. Although a time of about 12 min is required to transfer all the 25 substrates from the anodizing tank to the washing tank 303, this poses no problem because most electrolyte in the pores in the porous layer is replaced with pure water. The 25 substrates transferred to the washing tank 303 were cleaned using pure water for 10 min after the last substrate was transferred to the washing tank 303. The subsequent processes were executed as in the first embodiment, and 25 SOI substrates with uniform quality without any porous layer residue were obtained, as in the first embodiment.

(Fourth Embodiment)

The fourth embodiment will be described with reference to FIGS. 2 to 4.

The fourth embodiment uses the same apparatus arrangement as in the third embodiment, including the holder shape, the number of holders, and the substrate conveyor robot. The fourth embodiment is different from the third embodiment in that the electrolyte is not discharged after anodizing. In addition, while substrates are kept held in an anodizing tank 302, pure water is supplied into the anodizing tank 302 without discharging the electrolyte, thereby replacing the electrolyte with pure water in the anodizing tank 302.

The time in which the 25 substrates are exposed to the air is zero. In this case, however, the electrolyte is diluted and discarded, i.e., used for only one batch of anodizing. In addition, since the electrolyte is gradually diluted with pure water, a relatively long time is required until the electrolyte is completely replaced with pure water. In this example, the pure water rinse time in the anodizing tank 302 was about 1 hr and 20 min. After this, the pure water in the anodizing tank 302 is discharged, and the substrates were transferred to a washing tank 303 by a single substrate conveyor robot 106. The 25 substrates transferred to the washing tank 303 are cleaned with pure water for 10 min after the last substrate was transferred to the washing tank 303. The subsequent processes were executed as in the first embodiment, and 25 SOI substrates with uniform quality without any porous layer residue were obtained, as in the first embodiment.

(Fifth Embodiment)

The fifth embodiment will be described with reference to FIG. 2 and FIGS. 5 to 7.

The fifth embodiment uses the same apparatus arrangement as in the fourth embodiment, including the holder shape and the number of holders. However, the entire system including the substrate conveyance system is different.

Figure 5:
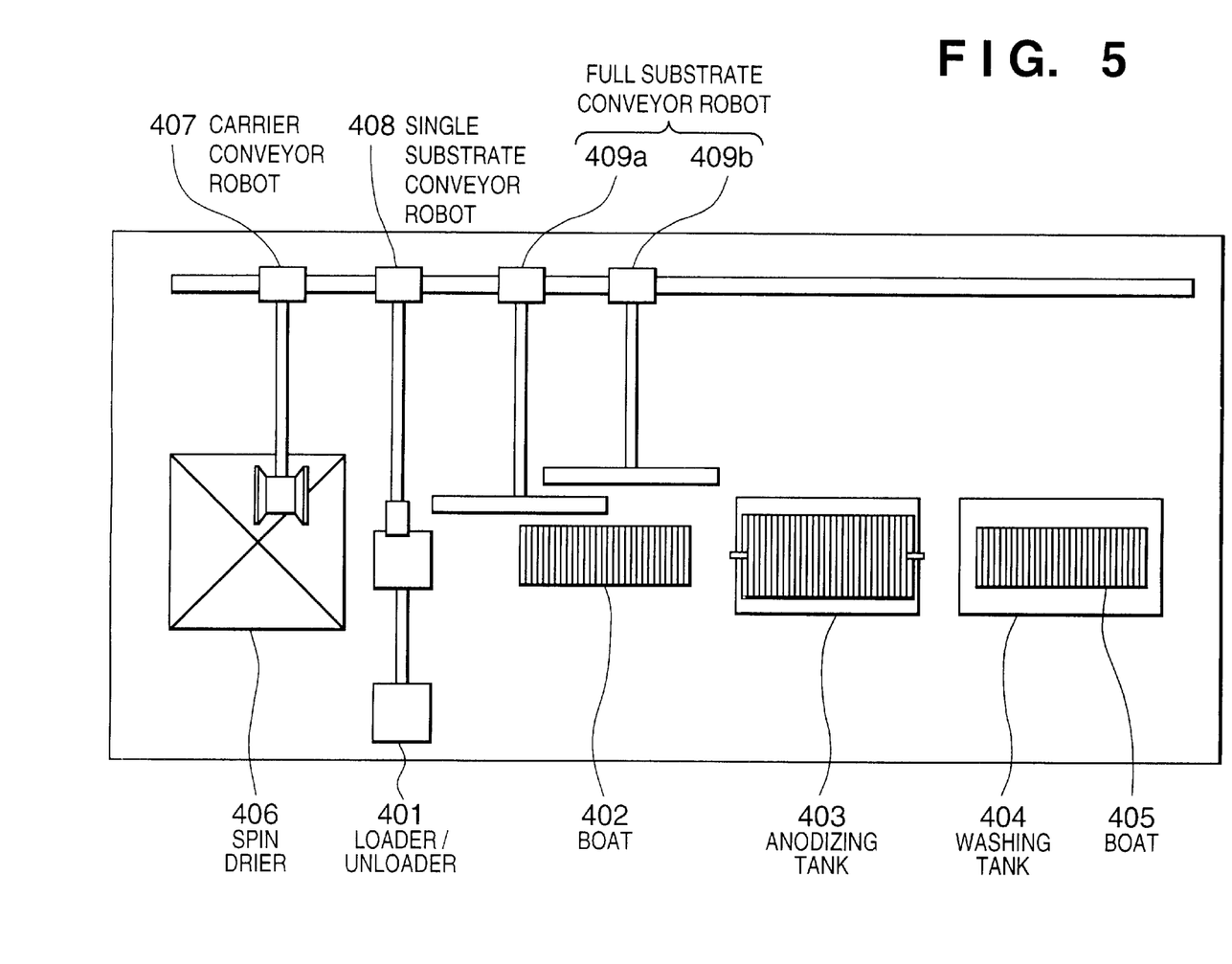
FIG. 5 is a view for explaining another example of the system of the anodizing apparatus.

FIG. 5 is a schematic plan view showing an anodizing system of the fifth embodiment.

Figure 6:
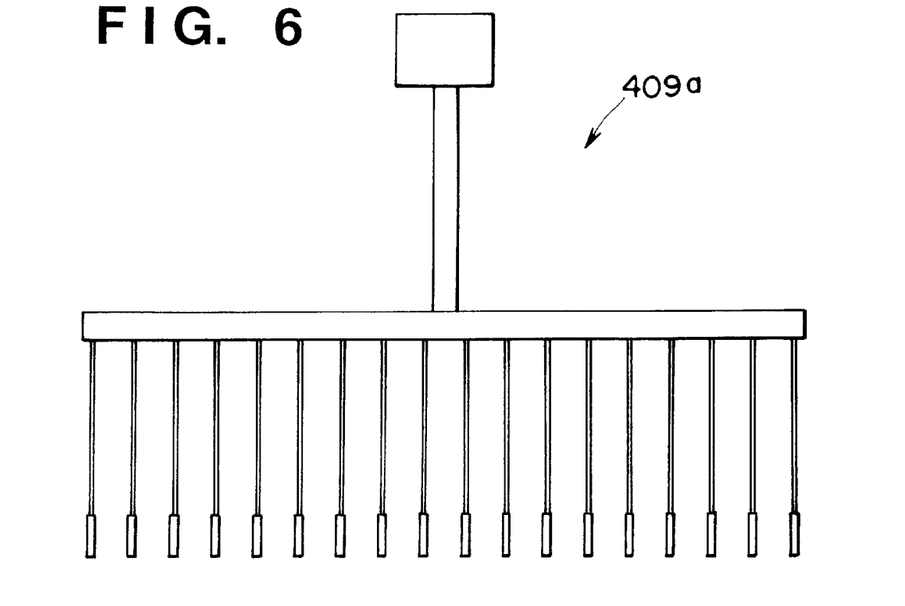
FIG. 6 is a view for explaining a substrate conveyor robot portion in the system shown in FIG. 5.

Substrates are placed on a loader 401 while kept stored in a carrier. The loader 401 also functions as an unloader. From the carrier set at a predetermined position by the loader 401, the substrates were transferred to a boat 402 by the single substrate conveyor robot 408 one by one. The boat 402 has 25 grooves at a pitch of 25 mm. The 25 substrates are set in the boat 402 and then held by a full substrate conveyor robot 409a at once. FIG. 6 shows a specific shape of the robot 409a. The robot 409a has the same function as that of the substrate conveyor robot 106a shown in FIG. 2 except that one arm has a function of chucking 25 substrates.

Figure 7:
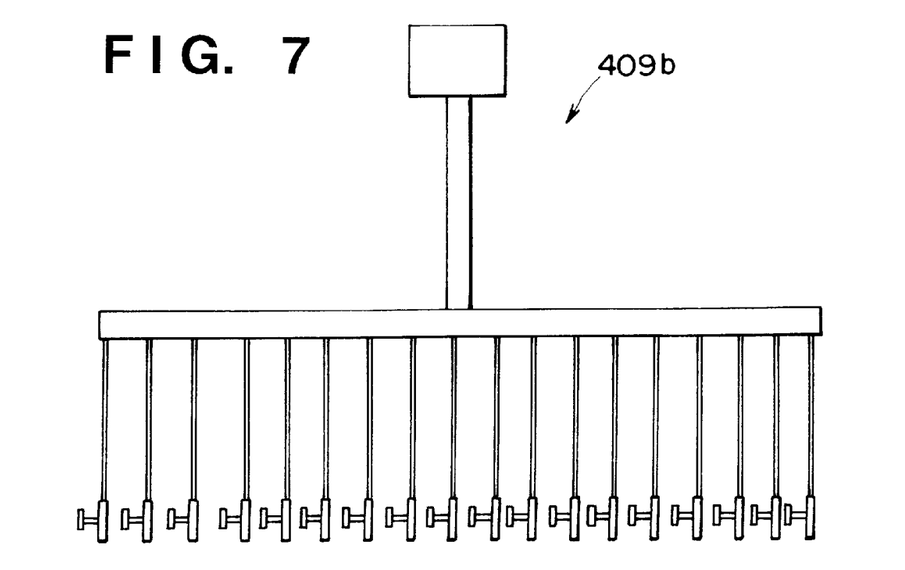
FIG. 7 is a view for explaining the substrate conveyor robot portion in the system shown in FIG. 5.

The 25 substrates are conveyed to an anodizing tank 403 while being held by the robot 409a. The substrates are set in holders by the same mechanism as in FIG. 2. However, instead of the substrate conveyor robot 106b shown in FIG. 2, a robot 409b as shown in FIG. 7, which has 25 robots 106b, is used. The 25 substrates are transferred to the full substrate conveyor robot 409a at once and set in the holders at once.

After anodizing, the electrolyte is discharged in about 30 sec. The substrates are conveyed from the anodizing tank 403 to a washing tank 404 using the full substrate conveyor robots 409a and 409b again. A boat 405 having the same structure as that at the preceding stage of the anodizing apparatus is sank in the washing tank 404. The substrates are placed on this boat 405. The conveyance time is about 40 sec, or about 1 min and 10 sec when the discharge time after anodizing is added. After washing in the washing tank 404 for 30 min, the substrates are transferred to the boat 402 by the full substrate conveyor robot 409a again.

The substrates are returned to the first carrier by the single substrate conveyor robot 408. The substrates stored in the carrier are conveyed to a spin drier 406 by a carrier conveyor robot 407, dried, and placed on the unloader 401.

Each substrate having a porous layer, which is obtained by the above operation, becomes an SOI substrate through the same processes as in the first embodiment.

The present invention can be applied to changes and modifications of the above embodiments without departing the spirit and scope of the invention.

As the method of removing the single-crystal silicon, for instance, the method of separating the single-crystal silicon by rotating the Si water using water jet power is preferable for recycling purpose.

As has been described above, in anodizing the surface of the semiconductor substrate, the time in which the substrate removed from the electrolyte is exposed to the air after anodizing is limited within a predetermined time. Subsequently, the substrate is rinsed with pure water to immediately dilute the electrolyte remaining in the pores in the porous layer and replace it with water. This method can be applied to the process of etching the porous layer while preventing any product difficult to etch from forming in the porous layer.

The present invention is not limited to the above embodiments and various changes and modifications can be made within the spirit and scope of the present invention. Therefore, to apprise the public of the scope of the present invention, the following claims are made.

What is claimed is:

1. A substrate processing method comprising the steps of:
   anodizing a single-crystal silicon substrate in an electrolytic solution to form a porous silicon layer on a major surface of the single-crystal silicon substrate;
   growing a single-crystal silicon film on the porous silicon layer;
   bonding a first substrate having the single-crystal silicon film to a second substrate as a supporting substrate so that the single-crystal silicon film is sandwiched between the first substrate and the second substrate;
   removing a single-crystal silicon portion from a lower surface side of the first substrate to expose the porous silicon layer; and
   etching the exposed porous silicon layer to remove the porous silicon layer on the single-crystal silicon film,
   wherein in washing after the anodizing step, a time in which the first substrate is removed from the electrolytic solution and exposed to the air until washing is set to be shorter than a time in which a compound produced by the electrolytic solution sticks to inner walls of pores formed by anodizing.

2. The method according to claim 1, wherein the electrolytic solution is a mixed solution containing fluoric acid.

3. The method according to claim 2, wherein the compound is $H_2SiF_6$.

4. The method according to claim 1, further comprising performing a heat treatment after the first and second substrates are bonded.

5. The method according to claim 1, further comprising oxidizing a surface of the single-crystal silicon film before the bonding step.

6. A substrate processing method comprising the steps of:
   anodizing a single-crystal silicon substrate in an electrolytic solution to form a porous silicon layer on a major surface of the single-crystal silicon substrate;
   growing a single-crystal silicon film on the porous silicon layer;
   bonding a first substrate having the single-crystal silicon film to a second substrate as a supporting substrate so that the single-crystal silicon film is sandwiched between the first substrate and the second substrate;
   removing a single-crystal silicon portion from a lower surface side of the first substrate to expose the porous silicon layer; and
   etching the exposed porous silicon layer to remove the porous silicon layer on the single-crystal silicon film,
   wherein in washing after the anodizing step, a time in which the first substrate is removed from the electrolytic solution and exposed to the air until washing is limited to be not more than 3 min.

7. The method according to claim 6, further comprising performing a heat treatment after the first and second substrates are bonded.

8. The method according to claim 6, further comprising oxidizing a surface of the single-crystal silicon film before the bonding step.

* * * * *